United States Patent
Schumacher et al.

(10) Patent No.: US 10,173,627 B2
(45) Date of Patent: Jan. 8, 2019

(54) METHOD AND DEVICE FOR MAINTAINING AN ACTUATOR FOR AN AIRBAG CONTROL DEVICE

(71) Applicant: Robert Bosch GmbH, Stuttgart (DE)

(72) Inventors: Hartmut Schumacher, Freiberg (DE); Ruediger Karner, Kornwestheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/557,377

(22) PCT Filed: Jan. 25, 2016

(86) PCT No.: PCT/EP2016/051402
§ 371 (c)(1),
(2) Date: Sep. 11, 2017

(87) PCT Pub. No.: WO2016/146280
PCT Pub. Date: Sep. 22, 2016

(65) Prior Publication Data
US 2018/0029554 A1 Feb. 1, 2018

(30) Foreign Application Priority Data

Mar. 13, 2015 (DE) ........................ 10 2015 204 612

(51) Int. Cl.
*G01R 31/00* (2006.01)
*G01R 31/02* (2006.01)
(Continued)

(52) U.S. Cl.
CPC ........ *B60R 21/0173* (2013.01); *G01R 31/005* (2013.01); *G01R 31/021* (2013.01); *G01R 31/2879* (2013.01); *G01R 31/06* (2013.01)

(58) Field of Classification Search
CPC .. B60R 21/0173; G01R 31/005; G01R 31/021
See application file for complete search history.

(56) References Cited

U.S. PATENT DOCUMENTS

| 5,596,497 A | 1/1997 | Honda |
| 2005/0231218 A1* | 10/2005 | Steinmill ............ B60R 21/0173 324/713 |

(Continued)

FOREIGN PATENT DOCUMENTS

| DE | 19837167 A1 | 11/1999 |
| DE | 102004042364 A1 | 6/2005 |
| DE | 102004049082 A1 | 4/2006 |

OTHER PUBLICATIONS https://web.archive.org/web/20130708143444/https://en.wikipedia.org/wiki/Dependent_source. (Year: 2013).*

(Continued)

*Primary Examiner* — Aaron L Troost
(74) *Attorney, Agent, or Firm* — Norton Rose Fulbright US LLP; Gerard Messina

(57) ABSTRACT

A method for maintaining an actuator for an airbag control device. The method has a step of impressing an electric current flow through the actuator using an electric voltage having a voltage value. In addition, the method has a step of ascertaining an electric measuring current through the actuator. Here, the electric measuring current through the actuator occurs on account of the impressed electric current flow through the actuator. In addition, the method has a step of executing a comparison of the electric measuring current through the actuator to a threshold value. Moreover, the method has a step of adjusting the voltage value of the electric voltage for impressing the electric current flow through the actuator as a function of the comparison.

21 Claims, 2 Drawing Sheets

(51) Int. Cl.
*G01R 31/06* (2006.01)
*G01R 31/28* (2006.01)
*B60R 21/017* (2006.01)

(56) References Cited

U.S. PATENT DOCUMENTS

| | | | |
|---|---|---|---|
| 2009/0055052 A1* | 2/2009 | You | B60R 21/0173 |
| | | | 701/45 |
| 2012/0256753 A1 | 10/2012 | Berland et al. | |
| 2015/0075401 A1* | 3/2015 | Edwards | B60R 21/264 |
| | | | 102/530 |

OTHER PUBLICATIONS

International Search Report dated Apr. 20, 2016, of the corresponding International Application PCT/EP2016/051402 filed Jan. 25, 2016.

* cited by examiner

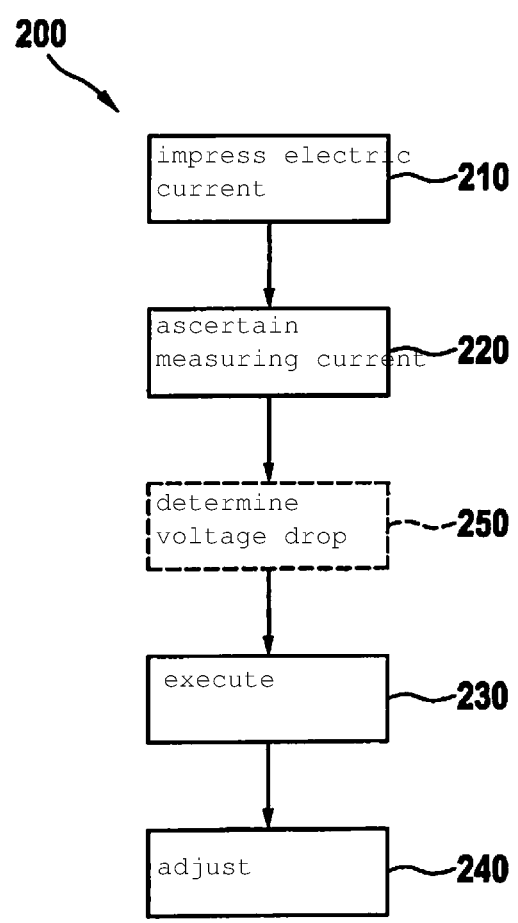

METHOD AND DEVICE FOR MAINTAINING AN ACTUATOR FOR AN AIRBAG CONTROL DEVICE

FIELD

The present invention relates to a method for maintaining an actuator for an airbag control device, to a corresponding device and to a corresponding computer program.

BACKGROUND INFORMATION

In an airbag control device it may be required, for example, that a status of an actuator of the control device be checked, especially on a permanent basis. Generally, this is able to be accomplished by a resistance measurement of the actuator, whose resistance value should lie within a predefined measuring range.

SUMMARY

In accordance with the present invention, a method is provided for maintaining an actuator for an airbag control device. In addition, a device, which uses this method, is provided and finally, a corresponding computer program according to the present invention. Advantageous further developments are described herein.

According to specific embodiments of the present invention, a correct status of the actuator is able to be determined in particular by impressing a current and monitoring An electric current flow through an actuator for an airbag control device, and, if necessary, the correct status is able to be restored by increasing the voltage for the current injection. This provides a possibility for supplying a voltage that is higher than a measuring voltage for the monitoring, for instance for cleaning contacts of the actuator should such cleaning be required, while a lower voltage is used for the measurement or for the check of the correct status in the normal case.

According to specific embodiments of the present invention, an elimination of transition resistances in actuator circuits of airbag control devices is advantageously possible, in particular. For example, this allows for a check of a proper or correct status of at least one actuator of an airbag control device, and especially for a permanent or continuous check, so that a potential non-availability may be indicated in a timely manner and countermeasures are able to be taken in addition or as an alternative. For example, a current measurement and, additionally or alternatively, a resistance measurement with regard to the actuator may be carried out for this purpose, for which the measuring values should then lie within a predefined measuring range in the correct state of the actuator. A first voltage level, at which an undesired activation of the actuator during the measurement is prevented or made more difficult, may be applied in the process, in particular for the measurement. This increases the safety with regard to an undesired activation. A higher voltage may be used for remedial maintenance, which is able to remove possible oxide layers on plug contacts of the actuator by a spark-over voltage, for instance. An increase in and an optimal exploitation of a service life, an improvement in the operating safety as well as reduced interruptions are achievable as a result, in particular for actuators for airbag control devices.

A method is introduced for maintaining an actuator for an airbag control device, said method including the following steps:

Impressing an electric current flow through the actuator using an electric voltage having a (predefined) voltage value;

Ascertaining an electric measuring current through the actuator, the electric measuring current through the actuator occurring on account of the impressed electric current flow through the actuator;

Carrying out a comparison of the electric measuring current through the actuator to a threshold value; and Adjusting the voltage value of the electric voltage for impressing the electric current flow through the actuator as a function of the comparison.

The present method may be executed in order to maintain an actuator, especially an actuator for an airbag control device. The method may also be executed for maintaining at least one actuator. In this context the maintenance may include carrying out an inspection, a servicing operation, a repair and, additionally or alternatively, an improvement. In the step of impressing, an electric current flow through the actuator is able to be induced. Here, the electric current flow represents an impressed electric current, and the electric measuring current represents a measured electric current.

According to one specific embodiment, in the step of impressing and additionally or alternatively in the step of adjusting, a first voltage value of the electric voltage may be used and, additionally or alternatively, a second voltage value of the electric voltage from among a group of predefined voltage values. In this context, the group may have a high voltage value and a low voltage value. Such a specific embodiment offers the advantage that, if warranted, only a switch between two known voltage values needs to take place in the step of adjusting. In addition, the predefined voltage values may be defined as compatible with the actuator.

Also, in the step of adjusting, the voltage value of the electric voltage may be increased from a first voltage value to a second voltage value if the result of the comparison in the step of executing shows that the electric measuring current through the actuator, which occurs on account of an electric current flow through the actuator impressed using an electric voltage having the first voltage value, is smaller than the threshold value. The first voltage value may have a minimum voltage value that may represent a measuring voltage. The second voltage value may have a maximum voltage value that may represent a supply voltage. The threshold value can represent an electric current that may indicate a contamination of contacts of the actuator when undershot by the electric measuring current, and that may indicate a correct condition of contacts of the actuator when exceeded by the electric measuring current. Such a specific embodiment offers the advantage of allowing for an uncomplicated and reliable cleaning of contacts of the actuators in order to restore a correct operating state of the actuator, and thus also of the airbag control device.

Furthermore, in the step of adjusting, the voltage value of the electric voltage may be reduced from a second voltage value to a first voltage value if the comparison in the step of executing has shown that the electric measuring current through the actuator, which occurs on account of an electric current flow through the actuator impressed using an electric voltage having the second voltage value, is greater than the threshold value. Such a specific embodiment offers the advantage that after the repairs have taken place, when the electric measuring current has reached a setpoint value again, for instance, function monitoring may be resumed using the minimum voltage.

In addition, in the step of adjusting, the voltage value of the electric current may be kept at a minimum voltage level if the result of the comparison in the step of executing shows that the electric measuring current through the actuator, which occurs on account of an electric current flow through the actuator impressed using an electric voltage value having the minimum voltage, is greater than the threshold value. For instance, such a specific embodiment offers the advantage that a permanent check of the actuator, in particular of its contacts, with regard to a correct status is able to be carried out in a safe manner using a minimal electric voltage.

In the step of impressing, the electric current flow may in particular be impressed at a current value that is lower than a current value of an activation current for activating the actuator. Such a specific embodiment offers the advantage that the actuator is able to be maintained in a reliable manner while safely avoiding an unintentional activation of the actuator.

According to a specific embodiment, the method may include a step of determining a voltage drop across the actuator in order to calculate an electric resistance of the actuator using the electric measuring current and the voltage drop. For the comparison, the electric resistance of the actuator may be compared to a further threshold value in the step of executing. The further threshold value may represent an electric resistance that may indicate a correct condition of contacts of the actuator when not reached, and may indicate soiling of contacts of the actuator when exceeded. Such a specific embodiment offers the advantage of allowing for an even more precise determination of either a correct status of the actuator or a determination that repairs are required for the actuator, specifically repairs of its contacts.

In addition, the approach presented here provides a device which is designed to execute, actuate or implement the steps of a variant of a method introduced here in corresponding devices. This embodiment variant of the present invention, in the form of a device, also makes it possible to rapidly and efficiently achieve the objective on which the present invention is based.

In this context, a device may be understood to describe an electrical device that processes sensor signals and outputs control and/or data signals as a function of such processing. The device may include an interface, which could be developed in the form of software and/or hardware. In the case of a hardware development, the interfaces may be part of what is known as a system ASIC, for example, which includes a variety of functions of the device. However, it is also possible that the interfaces are autonomous, integrated switching circuits or are at least partially made up of discrete components. In a software development, the interfaces may be software modules that are provided on a microcontroller in addition to other software modules, for example.

An airbag control device having an actuator and a specific embodiment of the aforementioned device is also introduced. An actuator, which is connected to a specific embodiment of the previously mentioned device in a manner that allows for the transmission of signals, is presented in addition.

Also advantageous is a computer program product or a computer program having program code which may be stored on a machine-readable carrier or storage medium such as a semiconductor memory, a hard disk memory or an optical memory, and which is used for executing, implementing and/or actuating the steps of the method as described in one of the previously described specific embodiments, in particular when the program product or the program is executed on a computer or on a control device.

The approach in accordance with the present invention is described in greater detail in the following text by way of example with the aid of the figures.

BRIEF DESCRIPTION OF THE DRAWINGS

FIG. 2 shows a flow diagram of a method for maintaining according to an exemplary embodiment of the present invention.

DETAILED DESCRIPTION OF EXAMPLE EMBODIMENTS

Figure 1:
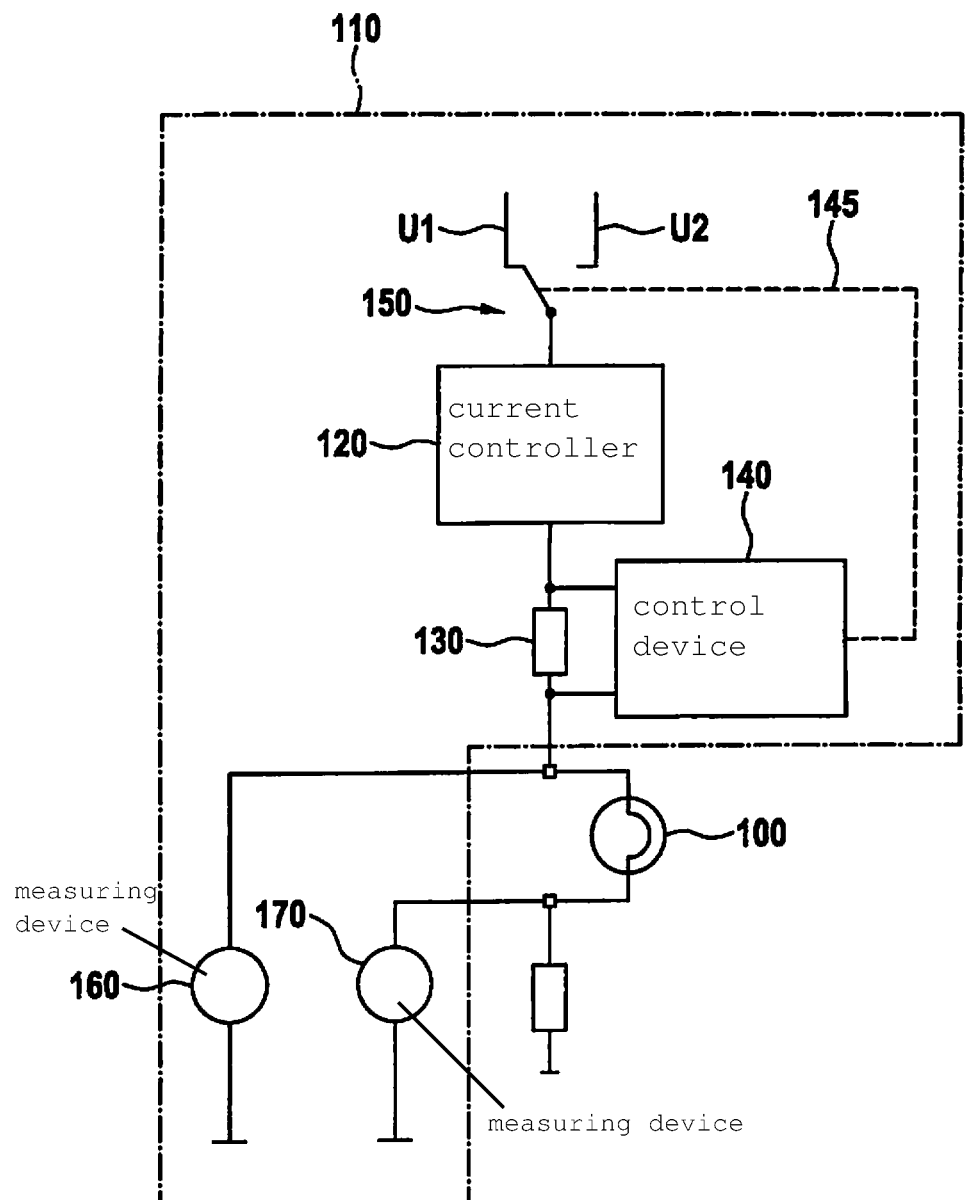
FIG. 1 is a schematic illustration of an actuator and a device for maintaining according to an exemplary embodiment of the present invention.

In the description below of advantageous exemplary embodiments of the present invention, identical or similar reference numerals are used for the elements that are illustrated in the various figures and have a similar effect, and a repeated description of these elements has been omitted.

FIG. 1 shows a schematic illustration of an actuator 100 and a maintenance device 110, i.e., a device for maintaining according to an exemplary embodiment of the present invention. Maintenance device 110 is developed to maintain actuator 100 or to carry out maintenance on actuator 100. Maintenance device 110 may also be described as a measuring circuit. Actuator 100 and maintenance device 110 are electrically connected to each other. According to the exemplary embodiment of the present invention illustrated in FIG. 1, actuator 100 is an actuator for an airbag control device, which is not shown in FIG. 1 simply for reasons of clarity and lack of space.

Maintenance device 110 has a current controller 120. According to the exemplary embodiment of the present invention shown in FIG. 1, current controller 120 is implemented as a constant current source. Current controller 120 is designed to impress an electric current flow through actuator 100. Here, current controller 120 is designed to impress the electric current flow through actuator 100 using an electric voltage having a voltage value. For this purpose, current controller 120 is connected to actuator 100 with the aid of an electrical line.

In addition, maintenance device 110 has a measuring resistance 130. Measuring resistance 130 is electrically interconnected between current controller 120 and actuator 100, and developed as a shunt resistance, in particular. Measuring resistance 130 is disposed between two taps to which a control device 140 of maintenance device 110 is electrically connected.

Control device 140 is connected in an electrically conductive manner to the taps between which measuring resistance 130 is situated. Control device 140 is designed to ascertain an electric measuring current through measuring resistance 130, and thus through actuator 100, via the taps. Because of the electric current flow that is impressed by current controller 120, the electrical measuring flow is able to be measured and occurs as a result of said current flow. Control device 140 is also developed to carry out a comparison of the ascertained electric measuring current with a threshold value. In addition, control device 140 is designed to adjust the voltage value of the electric voltage, through the use of which the electric current flow is able to be impressed with the aid of current controller 120, as a function of the result of the implemented comparison. To do so, control device 140 is connected via a control line 145 to a switch 150 of maintenance device 110 in a manner that allows for the transmission of signals. For example, control device 140 is developed to output an adjustment signal for adjusting the voltage value to switch 150 via control line 145.

Switch 150 is developed to receive the adjustment signal from control device 140. In addition, switch 150 is developed to switch a voltage supply for current controller 120 between a first voltage value U1 and a second voltage value U2 in response to the adjustment signal. In the illustration of FIG. 1, switch 150 is shown in a switch position in which first voltage value U1 has been selected for the electric voltage for impressing the electric current flow, or in which first voltage value U1 is applied to current controller 120. First voltage value U1 is lower than second voltage value U2 according to the exemplary embodiment shown in FIG. 1.

According to an exemplary embodiment, maintenance device 110 furthermore includes measuring devices 160 and 170 for determining a voltage drop across actuator 100. These are a first measuring device 160 for measuring a first actuator voltage, and a second measuring device 170 for measuring a second actuator voltage. For example, control device 140 may be developed to calculate an electrical resistance of actuator 100 using the ascertained electric measuring current and the voltage drop across actuator 100. In this case, control device 140 may furthermore be developed to compare the electrical resistance of actuator 100 determined in this manner to a further threshold value and to adjust the voltage value of the electric voltage as a function of the comparison.

In other words, maintenance device 110 or the measuring circuit is specifically developed to drive a constant current through actuator 100 and to measure the voltage drop across actuator 100. For example, in the event that a measuring current required for assuming a correct operation is not attained, then maintenance device 110 is developed to automatically switch to higher voltage value U2. If the threshold value for the electric measuring current is exceeded in so doing, maintenance device 110 is designed to automatically switch back to lower voltage value U1, for example. An adequate second voltage value U2 for the cleaning of contacts of actuator 100 of oxide layers amounts to at least 10 Volt, for instance.

Stated in different and more precise terms, maintenance device 110 has a constant current source of, for example, 60 milliampere, with current controller 120, which lies below an activation threshold of actuator 100. The constant current source supplies the electric current for the resistance measurement of actuator 100. Here, first voltage value U1 amounts to merely 6.7 Volt by way of example. The voltage drop across actuator 100 is measured with the aid of measuring devices 160 and 170. The resistance value of actuator 100 ($R_{actuator}$) is calculated from the quotient of the difference between first actuator voltage (V1) as well as second actuator voltage (V2) and the ascertained electric measuring current ($I_{meas}$). As a result, $R_{actuator}=(V1-V2)/I_{meas}$ is obtained in abbreviated form. The electric measuring current is measured via measuring resistance 130 or the shunt resistance and is compared to the threshold value or a setpoint value in control device 140. The threshold value or setpoint value may be 50 milliampere here, for example, and a correct operating range of actuator 100 is inferable above 50 milliampere. If the measured value or actual value of the electric measuring current is less than the threshold value or setpoint value, then switch 150 will be operated and current controller 120 will be supplied using the second voltage value U2, i.e., an increased supply voltage of 33 Volt, for example. If an electric measuring current of 60 milliampere, for instance, has been confirmed by control device 140, switch 150 is switched back to first voltage value U1 again, i.e., a lower measuring voltage of 6.7 Volt, for instance. Actuator 100 will therefore be monitored using the lower voltage value U1 again.

FIG. 2 shows a flow diagram of a method 200 for maintaining according to an exemplary embodiment of the present invention. Method 200 is able to be executed in order to carry out maintenance of an actuator for an airbag control device. Method 200 is able to be executed in conjunction with a device such as the device for maintenance from FIG. 1. In other words, the device for maintaining from FIG. 1 may be used in conjunction with method 200 for maintaining an actuator for an airbag control device.

Method 200 has a step 210 of impressing, a step 220 of ascertaining, a step 230 of executing, and a step 240 of adjusting. In step 210 of impressing, an electric current flow through the actuator is impressed using an electric voltage having a voltage value. In step 220 of ascertaining, an electric measuring current that is flowing through the actuator is ascertained. Here, the electric measuring current flowing through the actuator arises on account of the impressed electric current flow through the actuator. In step 230 of executing, a comparison of the electric measuring current flowing through the actuator to a threshold value is carried out. In step 240 of adjusting, the voltage value of the electric voltage for impressing the electric current flow through the actuator is adjusted as a function of the comparison.

According to an exemplary embodiment, method 200 has a step 250 of determining a voltage drop across the actuator in order to calculate an electric resistance of the actuator using the electric measuring current and the voltage drop. For the comparison, the electrical resistance of the actuator is compared with a further threshold value in step 230 of executing. Step 250 of ascertaining is able to be executed between step 220 of ascertaining and step 230 of executing, for example.

An execution of step 210 of impressing, step 220 of ascertaining, step 230 of executing, and step 240 of adjusting represents an iteration of method 200, for example. Optionally, step 250 of determining may likewise be part of the iteration of method 200. Following step 240 of adjusting, an execution of method 200 may begin anew at step 210 of impressing, for which the adjusted voltage value is used. As a consequence, it is also possible to execute multiple iterations of method 200.

Optionally, in step 210 of impressing and, additionally or alternatively, in step 240 of adjusting, a first voltage value of the electric voltage and/or a second voltage value of the electric voltage from among a group of predefined voltage values that has a low voltage value or a minimum voltage value as well as a high voltage value or a maximum voltage value, for instance, may be used. Also, step 210 of impressing in method 200 may be executed in such a way that a current value of an activation current for activating the actuator is undershot by a current value of the impressed electric current flow.

For example, according to an exemplary embodiment, the voltage value of the electric voltage is kept at a minimum voltage value in step 240 of adjusting in the event that the comparison in step 230 of executing shows that the electric measuring current through the actuator, which occurs on account of an electric current flow through the actuator impressed using an electric voltage having the minimum voltage value, is greater than the threshold value. As an alternative, in step 240 of adjusting, the voltage value of the electric voltage is increased from a first voltage value to a second voltage value in the event that the comparison in step 230 of executing shows that the electrical measuring current through the actuator, which occurs on account of an electric current flow through the actuator impressed using an electric voltage having the first voltage value, is lower than the threshold value. At least one iteration of method 200 using the second voltage value may then be carried out in step 210 of impressing. If the comparison in step 230 of executing reveals that the electric measuring current through the actuator, which occurs on account of an electric current flow through the actuator impressed using an electric voltage at the second voltage value, is greater than the threshold value, then the voltage value of the electric voltage is reduced from a second voltage value to a first voltage value in step 240 of adjusting.

The described exemplary embodiments that are illustrated in the figures have been selected merely by way of example. Different exemplary embodiments may be combined with one another, either completely or with regard to individual features. An exemplary embodiment may also be supplemented by features from another exemplary embodiment.

Furthermore, the method steps introduced here are also able to be executed repeatedly as well as in a sequence other than the sequence described.

If an exemplary embodiment includes an "and/or" linkage between a first feature and a second feature, then this should be interpreted as meaning that the exemplary embodiment according to one specific embodiment includes both the first feature and the second feature, and according to a further specific embodiment includes either only the first feature or only the second feature.

What is claimed is:

1. A method for maintaining an actuator for an airbag control device, the method comprising:
   impressing an electric current flow through the actuator using an electric voltage having a voltage value;
   ascertaining an electric measuring current through the actuator, the electric measuring current through the actuator occurring on account of the impressed electric current flow through the actuator;
   executing a comparison of the electric measuring current through the actuator to a threshold value; and
   adjusting the voltage value of the electric voltage for impressing the electric current flow through the actuator as a function of the comparison;
   wherein at least one of:
   (a) the impressing is performed using a current source and the ascertaining is performed by measuring the electric measuring current at a location between the current source and the actuator; and
   (b) (1) the impressing, executing, and adjusting are performed iteratively in a plurality of iterations, (2) in an initial one of the iterations, the adjusting includes raising the voltage value to a high voltage value in response to a result of the comparison of the respective iteration being that the electric measuring current does not satisfy the threshold value, and (3) the high voltage value is maintained in each subsequent one of the iterations until a first of the subsequent ones of the iterations in which the result of the comparison is that the electric measuring current satisfies the threshold value, in response to which the adjusting of the respective iteration includes lowering the voltage value to a low voltage value.

2. The method as recited in claim 1, wherein the voltage value in the steps of impressing and adjusting is selected from a group of predefined voltage values consisting of the high voltage value and the low voltage value.

3. The method as recited in claim 1, wherein in the step of adjusting, the voltage value of the electric voltage is increased from the low voltage value to the high voltage value if the comparison in step of executing shows that the electric measuring current through the actuator, which occurs on account of an electric current flow through the actuator impressed using an electric voltage having the first voltage value, is smaller than the threshold value.

4. The method as recited in claim 1, wherein in the step of adjusting, the voltage value of the electric voltage is lowered from the high voltage value to the low voltage value if the comparison in step of executing shows that the electric measuring current through the actuator, which occurs on account of an electric current flow through the actuator impressed using an electric voltage having the second voltage value, is greater than the threshold value.

5. The method as recited in claim 1, wherein in the step of adjusting, the voltage value of the electric voltage is kept at a minimum voltage value if the comparison in step of executing shows that the electric measuring current through the actuator, which occurs on account of an electric current flow through the actuator impressed using an electric voltage having the minimum voltage value, is greater than the threshold value.

6. The method as recited in claim 1, wherein in the step of impressing, the electric current flow is impressed using a current value that is lower than a current value of an activation current for activating the actuator.

7. The method as recited in claim 1, further comprising:
   determining a voltage drop across the actuator in order to calculate an electrical resistance of the actuator using the electric measuring current and the voltage drop, and in the step of executing, the electrical resistance of the actuator is compared to a further threshold value for the comparison.

8. The method as recited in claim 1, wherein the impressing is performed using the current source and the ascertaining is performed by measuring the electric measuring current at the location between the current source and the actuator.

9. The method as recited in claim 8, wherein the ascertaining is performed using a measuring resistance located between the current source and the actuator.

10. The method as recited in claim 9, wherein the ascertaining is performed using a control device, and the measuring resistance is located between two taps to which the control device is electrically connected.

11. The method as recited in claim 1, wherein (1) the impressing, executing, and adjusting are performed iteratively in a plurality of iterations, (2) in an initial one of the iterations, the adjusting includes raising the voltage value to a high voltage value in response to a result of the comparison of the respective iteration being that the electric measuring current does not satisfy the threshold value, and (3) the high voltage value is maintained in each subsequent one of the iterations until a first of the subsequent ones of the iterations in which the result of the comparison is that the electric measuring current satisfies the threshold value, in response to which the adjusting of the respective iteration includes lowering the voltage value to a low voltage value.

12. The method as recited in claim 11, wherein the low voltage value is 6.7 V.

13. The method as recited in claim 11, wherein the high voltage value is at least 10 V.

14. The method as recited in claim 11, wherein the high voltage value is 33 V.

15. The method as recited in claim 11, wherein the low voltage value is less than 10 V and the high voltage value is at least 10 V.

16. The method as recited in claim 15, wherein the low voltage value is 6.7 V.

17. The method as recited in claim 15, wherein the high voltage value is 33 V.

18. The method as recited in claim 15, wherein the low voltage value is 6.7 V and the high voltage value is 33 V.

19. The method as recited in claim 1, wherein the threshold current is 50 milliampere.

20. A device for maintaining an actuator for an airbag control device, the device comprising:
   a current source;
   a current sensor; and
   a current selector, wherein the current selector is configured to:
      impress an electric current flow from the current source and through the actuator using an electric voltage having a voltage value;
      ascertain an electric measuring current through the actuator using the current sensor, the electric measuring current through the actuator occurring on account of the impressed electric current flow through the actuator;
      execute a comparison of the electric measuring current through the actuator to a threshold value; and
      adjust the voltage value of the electric voltage for impressing the electric current flow through the actuator as a function of the comparison;
   wherein at least one of:
      (a) the ascertaining is performed by measuring the electric measuring current at a location between the current source and the actuator; and
      (b) (1) the impressing, executing, and adjusting are performed iteratively in a plurality of iterations, (2) in an initial one of the iterations, the adjusting includes raising the voltage value to a high voltage value in response to a result of the comparison of the respective iteration being that the electric measuring current does not satisfy the threshold value, and (3) the high voltage value is maintained in each subsequent one of the iterations until a first of the subsequent ones of the iterations in which the result of the comparison is that the electric measuring current satisfies the threshold value, in response to which the adjusting of the respective iteration includes lowering the voltage value to a low voltage value.

21. A non-transitory machine-readable storage medium on which is stored a computer program for maintaining an actuator for an airbag control device, the computer program, when executed by a processor, causing the processor to perform:
   impressing an electric current flow through the actuator using an electric voltage having a voltage value;
   ascertaining an electric measuring current through the actuator, the electric measuring current through the actuator occurring on account of the impressed electric current flow through the actuator;
   executing a comparison of the electric measuring current through the actuator to a threshold value; and
   adjusting the voltage value of the electric voltage for impressing the electric current flow through the actuator as a function of the comparison;
   wherein at least one of:
      (a) the impressing is performed using a current source and the ascertaining is performed by measuring the electric measuring current at a location between the current source and the actuator; and
      (b) (1) the impressing, executing, and adjusting are performed iteratively in a plurality of iterations, (2) in an initial one of the iterations, the adjusting includes raising the voltage value to a high voltage value in response to a result of the comparison of the respective iteration being that the electric measuring current does not satisfy the threshold value, and (3) the high voltage value is maintained in each subsequent one of the iterations until a first of the subsequent ones of the iterations in which the result of the comparison is that the electric measuring current satisfies the threshold value, in response to which the adjusting of the respective iteration includes lowering the voltage value to a low voltage value.

\* \* \* \* \*